US012701863B2

(12) United States Patent
Cheng et al.

(10) Patent No.: US 12,701,863 B2
(45) Date of Patent: *Aug. 4, 2026

(54) DISPLAY PANEL, PIXEL DRIVING CIRCUITS, AND DISPLAY DEVICE

(71) Applicant: WUHAN CHINA STAR OPTOELECTRONICS TECHNOLOGY CO., LTD., Wuhan (CN)

(72) Inventors: Hong Cheng, Wuhan (CN); Yanqing Guan, Wuhan (CN); Chao Tian, Wuhan (CN); Fei Ai, Wuhan (CN); Guanghui Liu, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 19/201,043

(22) Filed: May 7, 2025

(65) Prior Publication Data

US 2025/0268024 A1 Aug. 21, 2025

Related U.S. Application Data

(63) Continuation of application No. 17/771,484, filed as application No. PCT/CN2022/086573 on Apr. 13, 2022, now Pat. No. 12,324,311.

(30) Foreign Application Priority Data

Mar. 25, 2022 (CN) .......................... 202210306179.8

(51) Int. Cl.
*G09G 3/32* (2016.01)
*H10K 59/121* (2023.01)
(Continued)

(52) U.S. Cl.
CPC ........... *H10K 59/1213* (2023.02); *G09G 3/32* (2013.01); *H10K 59/1216* (2023.02);
(Continued)

(58) Field of Classification Search
CPC ........... H10K 59/1213; H10K 59/1216; H10K 59/123; G09G 3/32; G09G 2300/0426;
(Continued)

(56) References Cited

U.S. PATENT DOCUMENTS

2019/0206905 A1* 7/2019 Gu ...................... H10D 30/0316
2020/0243021 A1* 7/2020 Li ......................... G09G 3/3266
(Continued)

FOREIGN PATENT DOCUMENTS

CN     101937647 A     1/2011
CN     103226931 A     7/2013
(Continued)

OTHER PUBLICATIONS

Chinese Office Action issued in corresponding Chinese Patent Application No. 202210306179.8 dated Dec. 23, 2022, pp. 1-8, 19pp.
(Continued)

*Primary Examiner* — Temesghen Ghebretinsae
*Assistant Examiner* — Sosina Abebe
(74) *Attorney, Agent, or Firm* — The Roy Gross Law Firm, LLC; Roy D. Gross

(57) ABSTRACT

A display panel, a pixel driving circuit, and a display device are provided. Driving transistors include a first transistor and a second transistor connected in parallel. An absolute value of a threshold voltage of the first transistor is greater than an absolute value of a threshold voltage of the second transistor. A carrier mobility of the first transistor is greater than a carrier mobility of the second transistor. A driving current is affected by characteristics of the second transistor and an (Continued)

increase speed is slowed down, which improves a problem of color unevenness of the display panel at low brightness.

20 Claims, 4 Drawing Sheets

(51) Int. Cl.

| | | |
|---|---|---|
| *H10D 30/67* | (2025.01) |
| *H10D 86/40* | (2025.01) |
| *H10D 86/60* | (2025.01) |

(52) U.S. Cl.

CPC ............... *G09G 2300/0426* (2013.01); *G09G 2300/0842* (2013.01); *G09G 2300/0861* (2013.01); *G09G 2320/0233* (2013.01); *G09G 2320/0242* (2013.01); *H10D 30/6731* (2025.01); *H10D 30/6745* (2025.01); *H10D 30/6755* (2025.01); *H10D 86/423* (2025.01); *H10D 86/471* (2025.01); *H10D 86/481* (2025.01); *H10D 86/60* (2025.01)

(58) Field of Classification Search

CPC ... G09G 2300/0842; G09G 2300/0861; G09G 2320/0233; G09G 2320/0242; G09G 3/3233; G09G 2300/0819; G09G 2310/0251; H10D 30/6731; H10D 30/6745; H10D 30/6755; H10D 86/423; H10D 86/471; H10D 86/481; H10D 86/60

See application file for complete search history.

(56) References Cited

U.S. PATENT DOCUMENTS

| | | | | |
|---|---|---|---|---|
| 2021/0376040 | A1* | 12/2021 | Youn | .................. H10K 59/1315 |
| 2023/0120477 | A1* | 4/2023 | Hwang | ............... G09G 3/2081 |

FOREIGN PATENT DOCUMENTS

| | | | |
|---|---|---|---|
| CN | 110473494 | A | 11/2019 |
| CN | 110610684 | A | 12/2019 |
| CN | 110808010 | A | 2/2020 |
| CN | 112086070 | A | 12/2020 |
| CN | 112951154 | A | 6/2021 |
| CN | 113643663 | A | 11/2021 |
| CN | 113745253 | A | 12/2021 |
| JP | 2004317677 | A | 11/2004 |
| JP | 2007310346 | A | 11/2007 |

OTHER PUBLICATIONS

PCT International Search Report for International Application No. PCT/CN2022/086573, mailed on Nov. 30, 2022, 8pp.

Written Opinion of the International Searching Authority for International Application No. PCT/CN2022/086573, mailed on Nov. 30, 2022, 8pp.

* cited by examiner

DISPLAY PANEL, PIXEL DRIVING CIRCUITS, AND DISPLAY DEVICE

CROSS-REFERENCE TO RELATED APPLICATION

This application is a continuation application of U.S. application Ser. No. 17/771,484, filed on Apr. 24, 2022, which is a US national phase application based upon an International Application No. PCT/CN2022/086573, filed on Apr. 13, 2022, which claims priority to Chinese Patent Application No. 202210306179.8, filed on Mar. 25, 2022. The entire disclosures of the above applications are incorporated herein by reference in their entireties.

FIELD OF DISCLOSURE

The present disclosure relates to the field of display technologies, in particular to a display panel, a pixel driving circuit, and a display device.

BACKGROUND

In existing display panels, pixel driving circuit structures mostly adopt low temperature polysilicon technologies. However, a leakage current of a transistor is relatively large, and due to a limitation of the manufacturing process, the transistor will have uneven electrical properties, resulting in color unevenness of the display panel at low brightness.

SUMMARY OF DISCLOSURE

Embodiments of the present disclosure provide a display panel, a pixel driving circuit, and a display device to improve a problem of color unevenness of the display panel at low brightness.

An embodiment of the present disclosure provides a display panel. The display panel includes a plurality of light-emitting devices and a plurality of pixel driving circuits. Each of the pixel driving circuits is electrically connected to at least one of the light-emitting devices, each of the pixel driving circuits includes driving transistors, the driving transistors and a corresponding light-emitting device are connected in series between a first voltage terminal and a second voltage terminal, and the driving transistors include a first transistor and a second transistor connected in parallel.

An absolute value of a threshold voltage of the first transistor is greater than an absolute value of a threshold voltage of the second transistor, and a carrier mobility of the first transistor is greater than a carrier mobility of the second transistor.

Alternatively, in some embodiments of the present disclosure, an active layer of the first transistor and an active layer of the second transistor are of different types.

Alternatively, in some embodiments of the present disclosure, the active layer of the first transistor includes a silicon semiconductor, and the active layer of the second transistor includes an oxide semiconductor.

Alternatively, in some embodiments of the present disclosure, a difference between the absolute value of the threshold voltage of the first transistor and the absolute value of the threshold voltage of the second transistor is greater than or equal to 0.1 volts and less than or equal to 1 volt.

Alternatively, in some embodiments of the present disclosure, each of the pixel driving circuits further includes a third transistor and a storage capacitor. A source and a drain of the third transistor are electrically connected between a gate of the first transistor, a gate of the second transistor, and a data line, and a gate of the third transistor is electrically connected to a scan line. The storage capacitor is connected in series between the first voltage terminal, the gate of the first transistor, and the gate of the second transistor. An active layer of the third transistor includes an oxide semiconductor or a silicon semiconductor.

Alternatively, in some embodiments of the present disclosure, the display panel further includes a first semiconductor layer and a second semiconductor layer. The first semiconductor layer includes an active layer of the first transistor. The second semiconductor layer is disposed on the first semiconductor layer and includes an active layer of the second transistor. An orthographic projection of the active layer of the second transistor on the active layer of the first transistor overlaps the active layer of the first transistor.

Alternatively, in some embodiments of the present disclosure, the display panel further includes a first metal layer and a second metal layer. The first metal layer is disposed between the first semiconductor layer and the second semiconductor layer. The second metal layer is disposed on a side of the second semiconductor layer away from the first metal layer. The first metal layer includes a gate of the first transistor, the gate of the first transistor and the active layer of the first transistor at least partially overlap. The second metal layer includes a gate of the second transistor, the gate of the second transistor and the active layer of the second transistor at least partially overlap, and an orthographic projection of the gate of the second transistor on the first metal layer overlaps the gate of the first transistor.

Alternatively, in some embodiments of the present disclosure, the display panel further includes a third metal layer. The third metal layer is disposed on a side of the second metal layer away from the second semiconductor layer. The third metal layer includes a source and a drain, and orthographic projections of the source and the drain on the second metal layer are on both sides of the gate of the second transistor and are parallel to the gate of the second transistor. The first metal layer further includes connection parts disposed on both sides of the gate of the first transistor and parallel to the gate of the first transistor, and orthographic projections of the connection parts on the third metal layer at least partially overlap the source and the drain. The connection parts are electrically connected to the active layer of the first transistor, and the source and the drain are electrically connected to the connection parts and the active layer of the second transistor.

Alternatively, in some embodiments of the present disclosure, the pixel driving circuit further includes a third transistor, a fourth transistor, a fifth transistor, a sixth transistor, a seventh transistor, an eighth transistor, and a storage capacitor.

A source and a drain of the third transistor are electrically connected between one of a source and a drain of the first transistor, one of a source and a drain of the second transistor, and a data line, and a gate of the third transistor is electrically connected to a second scan line.

A gate of the fourth transistor is electrically connected to a first scan line, and a source and a drain of the fourth transistor are electrically connected between a gate of the first transistor, a gate of the second transistor, and a third voltage terminal.

A gate of the fifth transistor is electrically connected to a light-emitting control line, and a source and a drain of the fifth transistor are electrically connected between the first voltage terminal, the one of the source and the drain of the first transistor, and the one of the source and the drain of the second transistor.

A gate of the sixth transistor is electrically connected to the light-emitting control line, a source and a drain of the sixth transistor are electrically connected between another one of the source and the drain of the first transistor, another one of the source and the drain of the second transistor, and an anode of the light-emitting device.

A gate of the seventh transistor is electrically connected to the first scan line or the second scan line, and a source and a drain of the seventh transistor are electrically connected between the anode of the light-emitting device and a fourth voltage terminal.

A gate of the eighth transistor is electrically connected to the second scan line, a source and a drain of the eighth transistor are electrically connected between a gate and one of a source and a drain of one of the driving transistors; and The storage capacitor is connected in series between the first voltage terminal, the gate of the first transistor, and the gate of the second transistor.

An embodiment of the present disclosure also provides a pixel driving circuit, including driving transistors and a light-emitting device. The driving transistors include a first transistor and a second transistor connected in parallel. The light-emitting device is connected in series with the driving transistors between a first voltage terminal and a second voltage terminal. An absolute value of a threshold voltage of the first transistor is greater than an absolute value of a threshold voltage of the second transistor, the first transistor includes a silicon semiconductor layer, and the second transistor includes an oxide semiconductor layer.

Alternatively, in some embodiments of the present disclosure, the pixel driving circuit further includes a storage capacitor and a third transistor.

The storage capacitor is connected in series between gates of the driving transistors and the first voltage terminal. A gate of the third transistor is electrically connected to a scan line, one of a source and a drain of the third transistor is electrically connected to a data line, and another one of the source and the drain of the third transistor is electrically connected to the gates of the driving transistors.

An embodiment of the present disclosure also provides a display device, including any of the above-mentioned display panels or any of the above-mentioned pixel driving circuits.

In comparison with the prior art, the embodiments of the present disclosure provide the display panel, the pixel driving circuit, and the display device, and the display panel includes the plurality of light-emitting devices and the plurality of pixel driving circuits. Each of the pixel driving circuits is electrically connected to at least one of the light-emitting devices, each of the pixel driving circuits includes the driving transistors, the driving transistors and the corresponding light-emitting device are connected in series between the first voltage terminal and the second voltage terminal. The driving transistors include the first transistor and the second transistor connected in parallel. The absolute value of the threshold voltage of the first transistor is greater than the absolute value of the threshold voltage of the second transistor, and the carrier mobility of the first transistor is greater than the carrier mobility of the second transistor. When driving the corresponding light-emitting device to emit light, the second transistor is turned on earlier than the first transistor. Therefore, a current that drives the light-emitting device to emit light is affected by characteristics of the second transistor, and an increasing speed is slowed down, thereby improving a problem of color unevenness of the display panel at low brightness.

DETAILED DESCRIPTION

In order to make purposes, technical solutions, and effects of the present disclosure clearer and more specific, the present disclosure will be further described in detail below with reference to the accompanying drawings and embodiments. It should be understood that the specific embodiments described herein are only used to explain the present disclosure, but not to limit the present disclosure.

Figure 1:
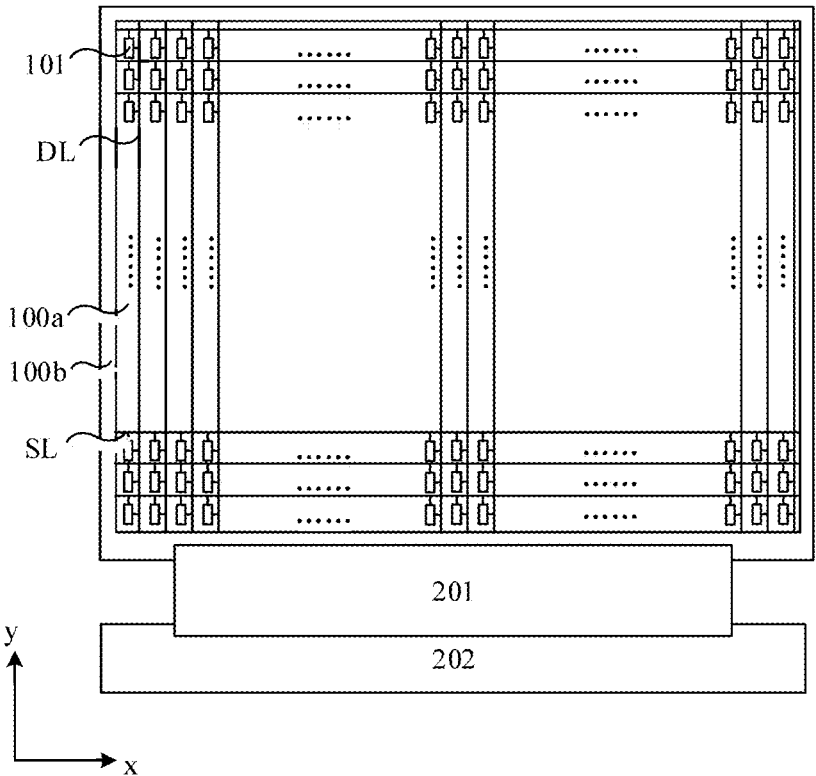
FIG. 1 is a schematic structural diagram of a display panel of an embodiment of the present disclosure.

Specifically, FIG. 1 is a schematic structural diagram of a display panel of an embodiment of the present disclosure. The display panel includes a display area 100a and a non-display area 100b disposed at a periphery of the display area 100a. The display panel includes a plurality of scan lines SL, a plurality of data lines DL, a plurality of light-emitting devices 101, and a plurality of pixel driving circuits.

The plurality of scan lines SL transmit a plurality of scan signals Scan. Alternatively, the plurality of scan lines SL are arranged along a second direction y and extend along a first direction x. The plurality of the scan lines SL are electrically connected between the plurality of pixel driving circuits and a driving module.

The plurality of data lines DL transmit a plurality of data signals. Alternatively, the plurality of data lines DL are arranged along the first direction x and extend along the second direction y. The plurality of the data lines DL are electrically connected between the plurality of pixel driving circuits and the driving module. Alternatively, the driving module includes a flexible circuit board 201 and a printed circuit board 202. Alternatively, the flexible circuit board 201 includes a chip on film.

The plurality of light-emitting devices 101 are disposed in the display area 100a, and luminous colors of the plurality of light-emitting devices 101 are not limited to red, green, blue, and the like.

Alternatively, the light-emitting devices 101 include organic light-emitting diodes, sub-millimeter light-emitting diodes, and miniature light-emitting diodes.

The plurality of pixel driving circuits are electrically connected to the plurality of light-emitting devices 101 to drive the corresponding light-emitting devices 101 to emit light according to the corresponding scan signals transmitted by the scan lines SL and the corresponding data signals transmitted by the data lines DL Alternatively, each of the pixel driving circuits is electrically connected to at least one of the light-emitting devices 101.

Figure 2A:
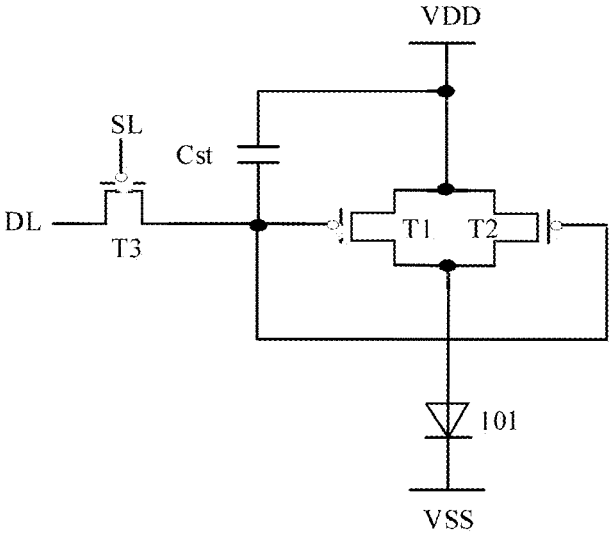
FIG. 2A to FIG. 2B are schematic structural diagrams of a pixel driving circuit of an embodiment of the present disclosure.
Figure 2B:
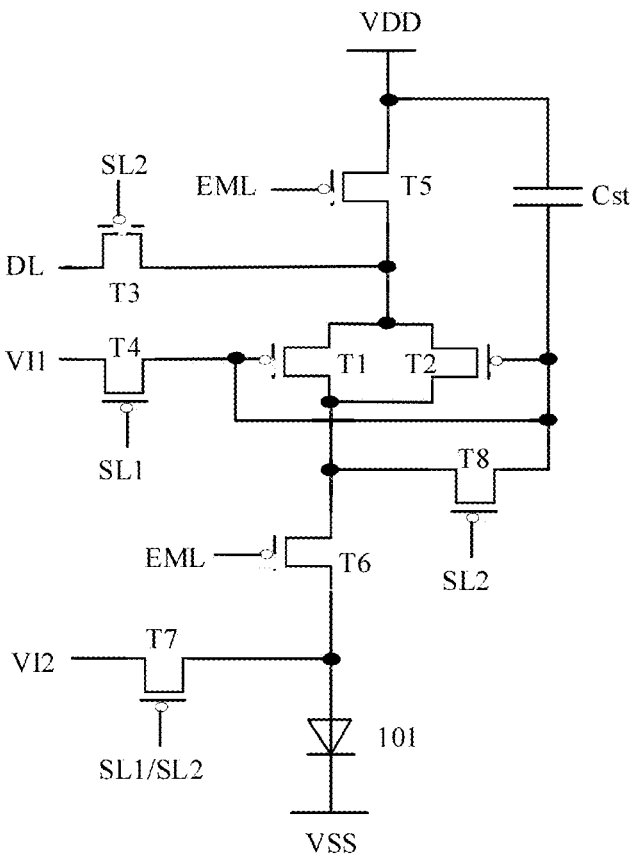

FIG. 2A to FIG. 2B are schematic structural diagrams of a pixel driving circuit of an embodiment of the present disclosure. The pixel driving circuit includes driving transistors. The driving transistors and a corresponding light-emitting devices 101 are connected in series between a first voltage terminal VDD and a second voltage terminal VSS.

Furthermore, the driving transistors include a first transistor T1 and a second transistor T2. The first transistor T1 is connected in parallel with the second transistor T2. An absolute value of a threshold voltage of the first transistor T1 is greater than an absolute value of a threshold voltage of the second transistor T2. A carrier mobility of the first transistor T1 is greater than a carrier mobility of the second transistor T2. When the driving transistors drive the light-emitting device 101 to emit light, the second transistor T2 is turned on earlier than the first transistor T1. A driving current Ids for driving the light-emitting device 101 to emit light is affected by characteristics of the second transistor T2, and an increasing speed is slowed down, thereby improving a problem of color unevenness of the display panel at low brightness.

Specifically, a gate of the first transistor T1 and a gate of the second transistor T2 are electrically connected. The gate of the first transistor T1 and the gate of the second transistor T2 are electrically connected to a corresponding data line DL. A source of the first transistor T1 and a source of the second transistor T2 are electrically connected. A drain of the first transistor T1 and a drain of the second transistor T2 are electrically connected. The source and the drain of the first transistor T1 and the source and the drain of the second transistor T2 are all electrically connected between the light-emitting device 101 and the second voltage terminal VSS or the first voltage terminal VDD.

Alternatively, an anode of the light-emitting device 101 is electrically connected to the first voltage terminal VDD. The source and the drain of the first transistor T1 and the source and the drain of the second transistor T2 are electrically connected between a cathode of the light-emitting device 101 and the second voltage terminal VSS.

Alternatively, the cathode of the light-emitting device 101 is electrically connected to the second voltage terminal VSS. The source and the drain of the first transistor T1 and the source and the drain of the second transistor T2 are electrically connected between the anode of the light-emitting device 101 and the first voltage terminal VDD.

The driving current $Ids=(Cox\mu mW/L)*(Vgs-Vth)2/2$ (Cox, $\mu m$, W, L respectively are channel capacitance per unit area, channel mobility, channel width, and channel width of a transistor; Vgs is a voltage between a gate and a source of the transistor, and Vth is a threshold voltage of the transistor). Thus, when the pixel driving circuit drives the corresponding light-emitting device 101 to emit light, the driving current Ids is dominated by the second transistor T2 that is turned on first. That is, a current flowing through the second transistor T2 that is turned on first increases as a gate-source voltage of the second transistor T2 increases. An increasing trend is slower than the current flowing through the first transistor T1 which is turned on later, thereby slowing down an increasing speed of the driving current Ids, which is beneficial to improve the color unevenness of the display panel at low brightness. When an absolute value of a voltage applied to the gate of the first transistor T1 is greater than the absolute value of the threshold voltage of the first transistor T1, the first transistor T1 is turned on. The current flowing through the first transistor T1 that is turned on later increases as an absolute value of a gate-source voltage of the first transistor T1 increases, and an increasing trend is faster than the current flowing through the second transistor T2 that is turned on early. It can satisfy a pulse width modulation (PWM) driving mode of the display panel at high brightness.

Alternatively, a difference between the absolute value of the threshold voltage of the first transistor T1 and the absolute value of the threshold voltage of the second transistor T2 is greater than or equal to 0.1 volts and less than or equal to 1 volt (that is, the difference between the absolute value of the threshold voltage of the first transistor T1 and the absolute value of the threshold voltage of the second transistor T2 may be equal to 0.1 volts, 0.2 volts, 0.25 volts, 0.3 volts, 0.4 volts, 0.5 volts, 0.55 volts, 0.6 volts, 0.7 volts, 0.75 volts, 0.8 volts, 0.9 volts, or 1 volt). It is ensured that the second transistor T2 can be turned on earlier than the first transistor T1, and that an interval between the first transistor T1 and the second transistor T2 being turned on is short, so as to prevent affecting a refresh rate of the display panel.

Furthermore, majority carriers in the first transistor T1 are of the same type as majority carriers in the second transistor T2. That is, the majority carriers of the first transistor T1 are electrons, and the majority carriers of the second transistor T2 are also electrons, so that the first transistor T1 and the second transistor T2 are turned on during a same high level period of the scan signal. Alternatively, the majority carriers of the first transistor T1 are holes, and the majority carriers of the second transistor T2 are also holes, so that the first transistor T1 and the second transistor T2 are turned on during a same low level period of the scan signal.

When the majority carriers of the first transistor T1 are electrons and the majority carriers of the second transistor T2 are also electrons, the first transistor T1 and the second transistor T2 are N-type transistors. The threshold voltage of the first transistor T1 is greater than the threshold voltage of the second transistor T2. When the majority carriers of the first transistor T1 are holes and the majority carriers of the second transistor T2 are also holes, the first transistor T1 and the second transistor T2 are P-type transistors. The threshold voltage of the first transistor T1 is lower than the threshold voltage of the second transistor T2. Therefore, the absolute value of the threshold voltage of the first transistor T1 is greater than the absolute value of the threshold voltage of the second transistor T2.

Alternatively, an active layer of the first transistor T1 and an active layer of the second transistor T2 are of different types, so that the first transistor T1 and the second transistor T2 have different carrier mobility.

Alternatively, the active layer of the first transistor T1 includes a silicon semiconductor, and the active layer of the second transistor T2 includes an oxide semiconductor.

Alternatively, the active layer of the first transistor T1 includes low temperature polysilicon, single crystal silicon, and other materials. The active layer of the second transistor T2 may include at least one of zinc oxide, zinc tin oxide, zinc indium oxide, indium oxide, titanium oxide, indium gallium zinc oxide, indium zinc tin oxide, and the like. Furthermore, the active layer of the first transistor T1 includes low temperature polysilicon material, and the active layer of the second transistor T2 includes indium gallium zinc oxide.

Figure 3:
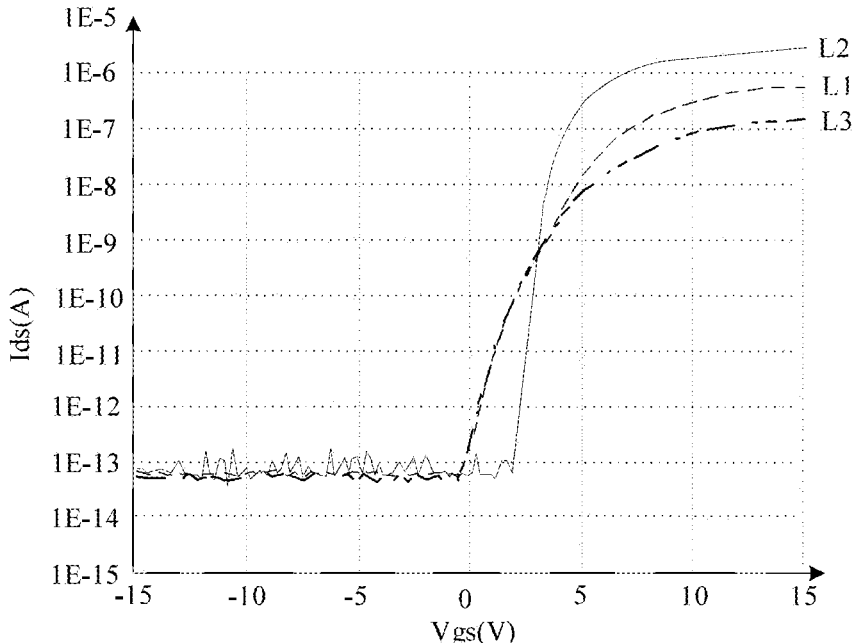
FIG. 3 is a schematic diagram of transfer characteristic curves of a first transistor and a second transistor connected in parallel of an embodiment of the present disclosure.

FIG. 3 is a schematic diagram of transfer characteristic curves of a first transistor and a second transistor connected in parallel of an embodiment of the present disclosure. The active layer of the first transistor T1 includes low temperature polysilicon material, and the active layer of the second transistor T2 includes indium gallium zinc oxide material.

L1 represents a transfer characteristic curve obtained by connecting the first transistor T1 and the second transistor T2 in parallel. L2 represents a transfer characteristic curve obtained from a single first transistor T1. L3 represents a transfer characteristic curve obtained from a single second transistor T2.

It can be seen from FIG. 3 that the absolute value of the threshold voltage of the first transistor T1 including the low temperature polysilicon material is greater than the absolute value of the threshold voltage of the second transistor T2 including the indium gallium zinc oxide material. In the transfer characteristic curve L2 obtained by the first transistor T1 including the low temperature polysilicon material, the driving current Ids increases faster with the increase of the voltage. In the transfer characteristic curve L3 obtained by the second transistor T2 including the indium gallium zinc oxide material, the driving current Ids increases slowly with the increase of the voltage. In the transfer characteristic curve L1 obtained by connecting the first transistor T1 and the second transistor T2 in parallel, the driving current Ids increases at a rate between the two. If the active layers of the first transistor T1 and the second transistor T2 connected in parallel include the oxide semiconductor material, although the problem of color unevenness at low brightness can be improved, it will affect the data written by the display panel (that is, the storage capacitor may not be able to be charged to a required potential), resulting in deviation of the driving current Ids, thereby causing deviation of the light-emitting brightness of the light-emitting device 101. If both the active layers of the first transistor T1 and the second transistor T2 connected in parallel include the silicon semiconductor material, since the driving current Ids increases faster with the increase of the voltage, it is not conducive to improving the problem of color unevenness at low brightness. Therefore, in order to improve both the problem of color unevenness at low brightness and the problem of light emission brightness deviation, the active layer of the first transistor T1 includes the silicon semiconductor, and the active layer of the second transistor T2 includes the oxide semiconductor. In addition, the plurality of second transistors T2 in the display area 100a of the display panel have relatively uniform electrical properties, which is also beneficial to improve the problem of color unevenness at low brightness.

Alternatively, the first transistor T1 and the second transistor T2 include field effect transistors. Alternatively, the first transistor T1 and the second transistor T2 are thin film transistors.

Referring to FIG. 2A to FIG. 2B, the pixel driving circuit also includes a third transistor T3 and a storage capacitor Cst.

A gate of the third transistor T3 is electrically connected to a corresponding scan line SL. A source and a drain of the third transistor T3 are electrically connected between the driving transistors and a corresponding data line DL. The third transistor T3 is configured to transmit a data signal transmitted by the data line DL to the gates of the driving transistors according to a corresponding scan signal.

The storage voltage capacitor Cst is connected in series between the gates of the driving transistors and the first terminal VDD. Specifically, a first terminal of the storage capacitor Cst is electrically connected to the first voltage terminal VDD. A second terminal of the storage capacitor Cst is electrically connected to the gate of the first transistor T1 and the gate of the second transistor T2. The storage capacitor Cst is configured to maintain gate voltages of the driving transistors.

Specifically, referring to FIG. 2A, one of the source and the drain of the third transistor T3 is electrically connected to the corresponding data line DL. Another one of the source and the drain of the third transistor T3 is electrically connected to the gates of the driving transistors. That is, the another one of the source and the drain of the third transistor T3 is electrically connected to the gate of the first transistor T1 and the gate of the second transistor T2.

Specifically, referring to 2B, the gate of the third transistor T3 is electrically connected to a second scan line SL2 that transmits a second scan signal Scan2. The source and the drain of the third transistor T3 are electrically connected between one of a source and a drain of one of the driving transistors and the corresponding data line DL. That is, one of the source and the drain of the third transistor T3 is electrically connected to the corresponding data line DL, and another other one of the source and the drain of the third transistor T3 is electrically connected to one of the source and the drain of the first transistor T1 and one of the source and the drain of the second transistor T2.

Alternatively, the active layer of the third transistor T3 includes oxide semiconductor or silicon semiconductor.

Referring to FIG. 2B, the pixel driving circuit also includes a fourth transistor T4, a fifth transistor T5, a sixth transistor T6, a seventh transistor T7, and an eighth transistor T8.

A gate of the fourth transistor T4 is electrically connected to a corresponding scan line SL. A source and a drain of the fourth transistor T4 are electrically connected between the gates of the driving transistors and a third voltage terminal VI1. The fourth transistor T4 is configured to reset the gate voltages of the driving transistors according to the corresponding scan signal and a voltage value provided by the third voltage terminal VI1. Specifically, the gate of the fourth transistor T4 is electrically connected to a first scan line SL1 that transmits a first scan signal Scan1. One of the source and the drain of the fourth transistor T4 is electrically connected to the gate of the first transistor T1 and the gate of the second transistor T2. Another one of the source and the drain of the fourth voltage transistor T4 is electrically connected to the third voltage terminal VI1.

A gate of the fifth transistor T5 is connected to a light-emitting control line EML. One of a source and a drain of the fifth transistor T5 is electrically connected to the first voltage terminal VDD. Another one of the source and the drain of the fifth transistor T5 is electrically connected to one of the source and the drain of the first transistor T1 and one of the source and the drain of the second transistor T2.

A gate of the sixth transistor T6 is electrically connected to the light-emitting control line EML. One of a source and a drain of the sixth transistor T6 is electrically connected to the another one of the source and the drain of the first transistor T1 and the another one of the source and the drain of the second transistor T2. Another one of the source and the drain of the sixth transistor T6 is electrically connected to the anode of the light-emitting device 101. The fifth transistor T5 and the sixth transistor T6 are configured to control the light-emitting device 101 to emit light according to a light-emitting control signal EM transmitted by the light-emitting control line EML.

A gate of the seventh transistor T7 is electrically connected to a corresponding scan line SL. A source and a drain of the seventh transistor are electrically connected between the anode of the light-emitting device 101 and a fourth voltage terminal VI2. The seventh voltage transistor T7 is configured to reset an anode voltage of the light-emitting device 101 according to the corresponding scan signal and a voltage value provided by the fourth voltage terminal VI2.

Specifically, the gate of the seventh transistor T7 is electrically connected to the first scan line SL1 that transmits the first scan signal Scan1 or the second scan line SL2 that transmits the second scan signal Scan2. One of the source and the drain of the seventh transistor is electrically connected to the anode of the light-emitting device 101. Another one of the source and the drain of the seventh transistor is electrically connected to the fourth voltage terminal VI2.

A gate of the eighth transistor T8 is electrically connected to a corresponding scan line SL. A source and a drain of the eighth transistor T8 are electrically connected between the gate and one of the source and the drain of one of the driving transistors. The eighth transistor T8 is configured to transmit a data signal with a compensated threshold voltage to the gates of the driving transistors according to a corresponding scan signal. Specifically, the gate of the eighth transistor T8 is electrically connected to the second scan line SL2 that transmits the second scan signal Scan2. One of the source and the drain of the eighth transistor T8 is electrically connected to the gate of the first transistor T1 and the gate of the second transistor T2. Another one of the source and the drain of the eighth transistor T8 is electrically connected to the another one of the source and the drain of the first transistor T1 and the another one of the source and the drain of the second transistor T2.

Referring to FIG. 2A, taking the first transistor T1, the second transistor T2, and the third transistor T3 as N-type transistors as examples, a working principle of the pixel driving circuit will be described. It can be understood that the first transistor T1, the second transistor T2, and the third transistor T3 can also be P-type transistors.

When the scan signal transmitted by the scan line SL is a high level signal, the first transistor T1 is turned on. The data signal transmitted by the data line DL is transmitted to the gate of the first transistor T1 and the gate of the second transistor T2 through the first transistor T1. Since the absolute value of the threshold voltage of the first transistor T1 is greater than the absolute value of the threshold voltage of the second transistor T2, the second transistor T2 is turned on earlier than the first transistor T1. The driving current Ids for driving the light-emitting device 101 to emit light is dominated by the second transistor T2. When the voltages applied to the gate of the first transistor T1 and the gate of the second transistor T2 continue to increase, the first transistor T1 is turned on. The driving current Ids for driving the light-emitting device 101 to emit light is dominated by the first transistor T1. When the scan signal transmitted by the scan line SL is a low level signal, the third transistor T3 is turned off. The light-emitting device 101 maintain light emission under an action of the storage capacitor Cst.

Figure 4:
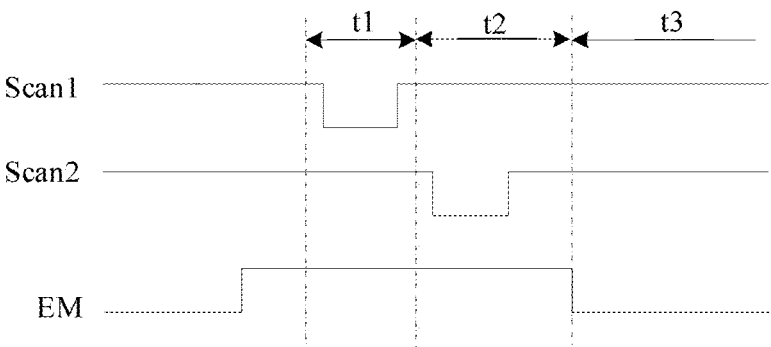
FIG. 4 is a timing diagram corresponding to the pixel driving circuit shown in FIG. 2B of an embodiment of the present disclosure.

FIG. 4 is a timing diagram corresponding to the pixel driving circuit shown in FIG. 2B of an embodiment of the present disclosure. Referring to FIG. 2B and FIG. 4B, the first transistor T1, the second transistor T2, the third transistor T3, the fourth transistor T4, the fifth transistor T5, the sixth transistor T6, the seventh transistor T7, and the eighth transistor T8 are P-type silicon transistors, and the eighth transistor T8 and the seventh transistor T7 share the second scan signal Scan2 as an example. In a period of a N-th frame (N Frame), an initialization stage t1, a data writing and compensation stage t2, and a light-emitting stage t3 are included.

In the initialization stage t1: the fourth transistor T4 is turned on according to the first scan signal Scan1 transmitted by the first scan line SL1. The gate voltage of the first transistor T1 and the gate voltage of the second transistor T2 are initialized through the third voltage terminal VI1.

In the compensation stage t2: the third transistor T3, the seventh transistor T7, and the eighth transistor T8 are turned on according to the second scan signal Scan2 transmitted by the second scan line SL2. The data signal with a function of compensating the threshold voltage transmitted by the data DL is transmitted to the gates of the driving transistors through the driving transistors and the eighth transistor T8. The storage capacitor Cst is charged so that the second transistor T2 is turned on earlier than the first transistor T1. The driving current Ids for driving the light-emitting device 101 to emit light is dominated by the second transistor T2. When the absolute values of the voltages applied to the gate of the first transistor T1 and the gate of the second transistor T2 continues to increase, the first transistor T1 is turned on. The driving current Ids for driving the light-emitting device 101 to emit light is dominated by the first transistor T1. The storage capacitor Cst maintains the gate voltages of the driving transistors, thereby compensating for the threshold voltages of the driving transistors. The seventh transistor T7 is turned on, and the anode voltage of the light-emitting device 101 is initialized through the fourth voltage terminal VI2.

In the light-emitting stage t3: the fifth transistor T5 and the sixth transistor T6 are turned on according to the light-emitting control signal EM transmitted by the light-emitting control line. The light-emitting device 101 keeps emitting light under the action of the storage capacitor Cst.

In comparison with the pixel driving circuit shown in FIG. 2B, the pixel driving circuit shown in FIG. 2A correspondingly has a larger space for designing a pixel since a number of transistors is less and an occupied wiring space is relatively small. It is beneficial to realize a high-resolution design of the display panel. Furthermore, it is beneficial to be used in virtual reality devices with higher resolution requirements.

Figure 5A:
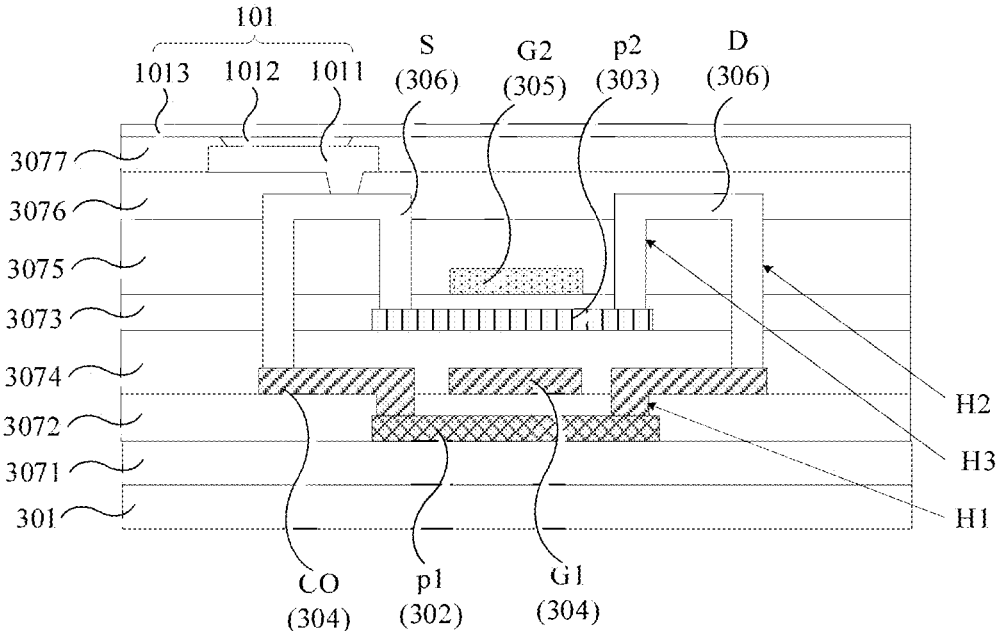
FIG. 5A to FIG. 5B are schematic structural diagrams of a first transistor and a second transistor of an embodiment of the present disclosure.
Figure 5B:
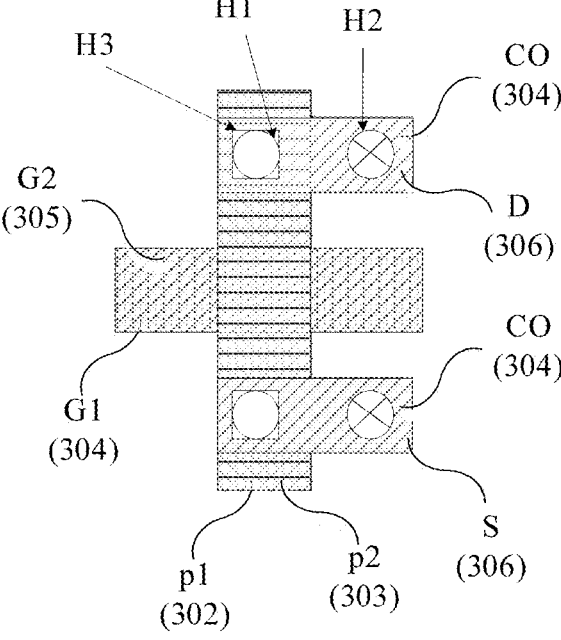

Referring to FIG. 5A to FIG. 5B, which are schematic structural diagrams of a first transistor and a second transistor of an embodiment of the present disclosure. The display panel includes a substrate 301, a first semiconductor layer 302, a second semiconductor layer 303, a first metal layer 304, a second metal layer 305, and a third metal layer 306.

The first semiconductor layer 302 is disposed on the substrate 301. Alternatively, the first semiconductor layer 302 includes silicon semiconductor or oxide semiconductor.

The second semiconductor layer 303 is disposed on a side of the first semiconductor layer 302 away from the substrate 301. Furthermore, semiconductor materials included in the first semiconductor layer 302 and the second semiconductor layer 303 are different. Alternatively, the second semiconductor layer 303 includes silicon semiconductor or oxide semiconductor.

Alternatively, the silicon semiconductor includes monocrystalline silicon, polycrystalline silicon, and the like. The oxide semiconductor includes oxides such as IGZO (InGaZnO), IGZTO (InGaZnSnO), and IGTO (InGaSnO).

The first metal layer 304 is disposed between the first semiconductor layer 302 and the second semiconductor layer 303. A formation material of the first metal layer 304 includes at least one of molybdenum, titanium, silver, and the like. A thickness of the first metal layer 304 may range from 5 nanometers to 500 nanometers.

The second metal layer 305 is disposed on a side of the second semiconductor layer 303 away from the first metal layer 304. A formation material of the second metal layer 305 includes at least one of molybdenum, titanium, silver, and the like. A thickness of the second metal layer 305 may range from 5 nanometers to 500 nanometers.

The third metal layer 306 is disposed on a side of the second metal layer 305 away from the second semiconductor layer 303. A formation material of the third metal layer 306 includes at least one of molybdenum, titanium, silver, and the like. A thickness of the third metal layer 306 may range from 5 nanometers to 500 nanometers.

Furthermore, the display panel further includes a buffer layer 3071, a first insulating layer 3072, a second insulating layer 3073, a first dielectric layer 3074, and a second dielectric layer 3075.

The buffer layer 3071 is disposed between the substrate 301 and the first semiconductor layer 302. A formation material of the buffer layer 3071 includes at least one of SiOx, SiNx, and SiON. A thickness of the buffer layer 3071 ranges from 10 nanometers to 1000 nanometers.

The first insulating layer 3072 is disposed between the first semiconductor layer 302 and the first metal layer 304. A formation material of the first insulating layer 3072 includes at least one of SiOx, SiNx, and SiON. A thickness of the first insulating layer 3072 ranges from 5 nanometers to 500 nanometers.

The second insulating layer 3073 is disposed between the second semiconductor layer 303 and the second metal layer 305. A formation material of the second insulating layer 3073 includes at least one of SiOx, SiNx, and SiON. A thickness of the second insulating layer 3073 ranges from 5 nanometers to 500 nanometers.

The first dielectric layer 3074 is disposed between the first metal layer 304 and the second semiconductor layer 303. A formation material of the first dielectric layer 3074 includes at least one of SiOx, SiNx, and SiON. A thickness of the first dielectric layer 3074 ranges from 10 nanometers to 1000 nanometers.

The second dielectric layer 3075 is disposed between the second metal layer 305 and the third metal layer 306. A formation material of the second dielectric layer 3075 includes at least one of SiOx, SiNx, and SiON. A thickness of the second dielectric layer 3075 ranges from 10 nanometers to 1000 nanometers.

Referring to FIG. 5A to FIG. 5B, taking the first semiconductor layer 302 including silicon semiconductor and the second semiconductor layer 303 including oxide semiconductor as an example, the first layer 302 includes the active layer p1 of the first transistor T1, and the second semiconductor layer 303 includes the active layer p2 of the second transistor T2. An orthographic projection of the active layer p2 of the second transistor T2 on the active layer p1 of the first transistor T1 overlaps the active layer p1 of the first transistor T1.

The first metal layer 304 includes the gate G1 of the first transistor T1, and the gate G1 of the first transistor T1 at least partially overlaps the active layer p1 of the first transistor T1.

The second metal layer 305 includes the gate G2 of the second transistor T2. The gate G2 of the second transistor T2 and the active layer p2 of the second transistor T2 at least partially overlap. An orthographic projection of the gate G2 of the second transistor T2 on the first metal layer 304 overlaps the gate G1 of the first transistor T1.

The third metal layer 306 includes a source S and a drain D. Orthographic projections of the source S and the drain D on the second metal layer 305 are located on both sides of the gate G2 of the second transistor T2 and are parallel to the gate G2 of the second transistor T2.

The first metal layer 304 further includes connection parts CO disposed on both sides of the gate G1 of the first transistor T1 and parallel to the gate G1 of the first transistor T1. Orthographic projections of the connection parts CO on the third metal layer 306 at least partially overlaps the source S and the drain D.

The connection parts CO and the active layer p1 of the first transistor T1 are electrically connected through first via holes H1 in the first insulating layer 3072. The source S and the drain D are electrically connected to the connection parts CO through second via holes H2 extending the second dielectric layer 3075, the second insulating layer 3073, and the first dielectric layer 3074. The source S and the drain D are electrically connected to the active layer p2 of the second transistor T2 through third via holes H3 extending the second dielectric layer 3075 and the second insulating layer 3073. Thus, the source S and the drain D are electrically connected to the connection parts CO and the active layer p2 of the second transistor T2. The source S and the drain D correspondingly form the sources and the drains of the first transistor T1 and the second transistor T2, so as to realize that the source of the first transistor T1 and the source of the second transistor T2 are electrically connected, and the drain of the first transistor T1 and the drain of the second transistor T2 are electrically connected.

By setting the first transistor T1 and the second transistor T2 in parallel in the form shown in FIG. 5A to FIG. 5B, a wiring space can be saved, and the resolution and light transmittance of the display panel can be improved.

Referring to FIG. 5A to FIG. 5B, the display panel further includes a third insulating layer 3076 and a pixel definition layer 3077. The third insulating layer 3076 is disposed between the third metal layer 306 and the anode 1011 of the light-emitting device 101. The anode 1011 is electrically connected to one of the source S and the drain D through a via hole extending through the third insulating layer 3076. The pixel definition layer 3077 is disposed on the anode 1011 of the light-emitting device 101. A light-emitting layer 1012 of the light-emitting device 101 is disposed in a pixel definition region of the pixel definition layer 3077. The cathode 1013 of the light-emitting device 101 is disposed on a side of the light-emitting layer 1012 away from the anode 1011.

The present disclosure also provides a drive circuit. Alternatively, the driving circuit includes pixel driving circuits, backlight driving circuits, and the like.

The driving circuit includes driving transistors and a light-emitting device. The light-emitting device and the driving transistors are connected in series between a first voltage terminal and a second voltage terminal. The driving transistors include a first transistor and a second transistor connected in parallel. An absolute value of a threshold voltage of the first transistor is greater than an absolute value of a threshold voltage of the second transistor. The first transistor includes a silicon semiconductor layer. The second transistor includes an oxide semiconductor layer. When the driving transistors drive the light-emitting device to emit light, the second transistor is turned on earlier than the first transistor. The driving current for driving light-emitting device to emit light is affected by characteristics of the second transistor, and an increasing speed is slowed down, which improves a problem of color unevenness of a display panel at low brightness.

Specifically, a gate of the first transistor and a gate of the second transistor are electrically connected. The gate of the first transistor and the gate of the second transistor are electrically connected to a corresponding data line. A source of the first transistor and a source of the second transistor are electrically connected. A drain of the first transistor and a drain of the second transistor are electrically connected. The source and the drain of the first transistor and the source and the drain of the second transistor are all electrically connected between an anode of the light-emitting device and the first voltage terminal. A cathode of the light-emitting device is electrically connected to the second voltage terminal.

Furthermore, the driving circuit further includes a storage capacitor. The storage capacitor is connected in series between the gates of the driving transistors and the first voltage terminal.

Alternatively, the driving circuit further includes a third transistor. A gate of the third transistor is electrically connected to a corresponding scan line. One of a source and a drain of the third transistor is electrically connected to the corresponding data line. Another one of the source and the drain of the third transistor is electrically connected to the gates of the driving transistors.

Alternatively, the driving circuit further includes a third transistor, a fourth transistor, a fifth transistor, a sixth transistor, a seventh transistor, and an eighth transistor.

A gate of the third transistor is electrically connected to the corresponding scan line. One of a source and a drain of the third transistor is electrically connected to the corresponding data line. Another one of the source and the drain of the third transistor is electrically connected to one of the source and the drain of one of the driving transistors.

A gate of the fourth transistor is electrically connected to the corresponding scan line. One of a source and a drain of the fourth transistor is electrically connected to the gates of the driving transistors. Another one of the source and the drain of the fourth transistor is electrically connected to a third voltage terminal.

A gate of the fifth transistor is electrically connected to a light-emitting control line. One of a source and a drain of the fifth transistor is electrically connected to the first voltage terminal. Another one of the source and the drain of the fifth transistor is electrically connected to one of the source and the drain of one of the driving transistors.

A gate of the sixth transistor is electrically connected to the light-emitting control line. One of a source and a drain of the sixth transistor is electrically connected to the another one of the source and the drain of one of the driving transistors. Another one of the source and the drain of the sixth transistor is electrically connected to an anode of the light-emitting device.

A gate of the seventh transistor is electrically connected to the corresponding scan line. One of a source and a drain of the seventh transistor is electrically connected to the anode of the light-emitting device. Another one of the source and the drain of the seventh transistor is electrically connected to the third voltage terminal.

A gate of the eighth transistor is electrically connected to the corresponding scan line. One of a source and a drain of the eighth transistor is electrically connected to the gates of the driving transistors. Another one of the source and the drain of the eighth transistor is electrically connected to the another one of the source and the drain of one of the driving transistors.

The present disclosure also provides a display device. The display device includes any of the above-mentioned driving circuits or any of the above-mentioned display panels.

Understandably, the display device includes a movable display device (such as a notebook computer, a mobile phone, etc.), a fixed terminal (such as a desktop computer, a TV, etc.), a measuring device (such as a sports bracelet, a thermometer, etc.), and the like.

The principles and implementations of the present disclosure are described in this specification by using specific embodiments, and the descriptions of the above embodiments are only used to help understand the method and the core idea of the present disclosure. Meanwhile, for those skilled in the art, according to the idea of the present disclosure, there will be changes in the specific implementation manner and application scope. In conclusion, the content of this specification should not be construed as a limitation on the present disclosure.

What is claimed is:

1. A display panel, comprising:
   a plurality of light-emitting devices; and
   a plurality of pixel driving circuits, wherein each of the pixel driving circuits is electrically connected to at least one of the light-emitting devices, each of the pixel driving circuits comprises driving transistors, the driving transistors and a corresponding light-emitting device are connected in series between a first voltage terminal and a second voltage terminal, and the driving transistors comprise a first transistor and a second transistor connected in parallel; and
   wherein an absolute value of a threshold voltage of the first transistor is greater than an absolute value of a threshold voltage of the second transistor, and a carrier mobility of the first transistor is greater than a carrier mobility of the second transistor;
   wherein the display panel further comprises:
   a first semiconductor layer comprising an active layer of the first transistor;
   a second semiconductor layer comprising an active layer of the second transistor;
   a first metal layer; and
   a second metal layer;
   wherein an orthographic projection of the active layer of the second transistor on the active layer of the first transistor overlaps the active layer of the first transistor;
   wherein the first metal layer comprises a gate of the first transistor, the gate of the first transistor and the active layer of the first transistor at least partially overlap; the second metal layer comprises a gate of the second transistor, the gate of the second transistor and the active layer of the second transistor at least partially overlap, and an orthographic projection of the gate of the second transistor on the first metal layer overlaps the gate of the first transistor.

2. The display panel according to claim 1, wherein the active layer of the first transistor and the active layer of the second transistor are of different types.

3. The display panel according to claim 2, wherein the active layer of the first transistor comprises a silicon semiconductor, and the active layer of the second transistor comprises an oxide semiconductor.

4. The display panel according to claim 1, wherein a difference between the absolute value of the threshold voltage of the first transistor and the absolute value of the threshold voltage of the second transistor is greater than or equal to 0.1 volts and less than or equal to 1 volt.

5. The display panel according to claim 1, wherein each of the pixel driving circuits further comprises:
   a third transistor, wherein a source and a drain of the third transistor are electrically connected between a gate of the first transistor, a gate of the second transistor, and a data line, and a gate of the third transistor is electrically connected to a scan line; and a storage capacitor connected in series between the first voltage terminal, the gate of the first transistor, and the gate of the second transistor;

wherein an active layer of the third transistor comprises an oxide semiconductor or a silicon semiconductor.

6. The display panel according to claim 1, wherein the second semiconductor layer is disposed on the first semiconductor layer.

7. The display panel according to claim 6, wherein the first metal layer is disposed between the first semiconductor layer and the second semiconductor layer, and the second metal layer is disposed on a side of the second semiconductor layer away from the first metal layer;

wherein the display panel further discloses a third metal layer disposed on a side of the second metal layer away from the second semiconductor layer, wherein the third metal layer comprises a source and a drain, and orthographic projections of the source and the drain on the second metal layer are on both sides of the gate of the second transistor and are parallel to the gate of the second transistor.

8. The display panel according to claim 7, wherein the first metal layer further comprises connection parts disposed on both sides of the gate of the first transistor and parallel to the gate of the first transistor, and orthographic projections of the connection parts on the third metal layer at least partially overlap the source and the drain.

9. The display panel according to claim 1, wherein the pixel driving circuit further comprises:

a third transistor, wherein a source and a drain of the third transistor are electrically connected between one of a source and a drain of the first transistor, one of a source and a drain of the second transistor, and a data line, and a gate of the third transistor is electrically connected to a second scan line;

a fourth transistor, wherein a gate of the fourth transistor is electrically connected to a first scan line, and a source and a drain of the fourth transistor are electrically connected between a gate of the first transistor, a gate of the second transistor, and a third voltage terminal;

a fifth transistor, wherein a gate of the fifth transistor is electrically connected to a light-emitting control line, and a source and a drain of the fifth transistor are electrically connected between the first voltage terminal, the one of the source and the drain of the first transistor, and the one of the source and the drain of the second transistor;

a sixth transistor, wherein a gate of the sixth transistor is electrically connected to the light-emitting control line, a source and a drain of the sixth transistor are electrically connected between another one of the source and the drain of the first transistor, another one of the source and the drain of the second transistor, and an anode of the light-emitting device;

a seventh transistor, wherein a gate of the seventh transistor is electrically connected to the first scan line or the second scan line, and a source and a drain of the seventh transistor are electrically connected between the anode of the light-emitting device and a fourth voltage terminal;

an eighth transistor, wherein a gate of the eighth transistor is electrically connected to the second scan line, a source and a drain of the eighth transistor are electrically connected between a gate and one of a source and a drain of one of the driving transistors; and a storage capacitor connected in series between the first voltage terminal, the gate of the first transistor, and the gate of the second transistor.

10. A pixel driving circuit, comprising:

driving transistors, wherein the driving transistors comprise a first transistor and a second transistor connected in parallel; and a light-emitting device connected in series with the driving transistors between a first voltage terminal and a second voltage terminal;

wherein an absolute value of a threshold voltage of the first transistor is greater than an absolute value of a threshold voltage of the second transistor, the first transistor comprises a silicon semiconductor layer, and the second transistor comprises an oxide semiconductor layer;

wherein an orthographic projection of an active layer of the second transistor on an active layer of the first transistor overlaps the active layer of the first transistor;

wherein a gate of the first transistor and the active layer of the first transistor at least partially overlap;

wherein a gate of the second transistor and the active layer of the second transistor at least partially overlap, and an orthographic projection of the gate of the second transistor on the gate of the first transistor overlaps the gate of the first transistor.

11. The pixel driving circuit according to claim 10, further comprising:

a storage capacitor connected in series between gates of the driving transistors and the first voltage terminal; and a third transistor, wherein a gate of the third transistor is electrically connected to a scan line, one of a source and a drain of the third transistor is electrically connected to a data line, and another one of the source and the drain of the third transistor is electrically connected to the gates of the driving transistors.

12. A display device, comprising a display panel, wherein the display panel comprises:

a plurality of light-emitting devices; and a plurality of pixel driving circuits, wherein each of the pixel driving circuits is electrically connected to at least one of the light-emitting devices, each of the pixel driving circuits comprises driving transistors, the driving transistors and a corresponding light-emitting device are connected in series between a first voltage terminal and a second voltage terminal, and the driving transistors comprise a first transistor and a second transistor connected in parallel; and wherein an absolute value of a threshold voltage of the first transistor is greater than an absolute value of a threshold voltage of the second transistor, and a carrier mobility of the first transistor is greater than a carrier mobility of the second transistor;

wherein the display panel further comprises:

a first semiconductor layer comprising an active layer of the first transistor;

a second semiconductor layer and comprising an active layer of the second transistor;

a first metal layer; and a second metal layer;

wherein an orthographic projection of the active layer of the second transistor on the active layer of the first transistor overlaps the active layer of the first transistor;

wherein the first metal layer comprises a gate of the first transistor, the gate of the first transistor and the active layer of the first transistor at least partially overlap; the second metal layer comprises a gate of the second transistor, the gate of the second transistor and the active layer of the second transistor at least partially overlap, and an orthographic projection of the gate of the second transistor on the first metal layer overlaps the gate of the first transistor.

13. The display device according to claim 12, wherein the active layer of the first transistor and the active layer of the second transistor are of different types.

14. The display device according to claim 13, wherein the active layer of the first transistor comprises a silicon semiconductor, and the active layer of the second transistor comprises an oxide semiconductor.

15. The display device according to claim 12, wherein a difference between the absolute value of the threshold voltage of the first transistor and the absolute value of the threshold voltage of the second transistor is greater than or equal to 0.1 volts and less than or equal to 1 volt.

16. The display device according to claim 12, wherein each of the pixel driving circuits further comprises:

a third transistor, wherein a source and a drain of the third transistor are electrically connected between a gate of the first transistor, a gate of the second transistor, and a data line, and a gate of the third transistor is electrically connected to a scan line; and a storage capacitor connected in series between the first voltage terminal, the gate of the first transistor, and the gate of the second transistor;

wherein an active layer of the third transistor comprises an oxide semiconductor or a silicon semiconductor.

17. The display device according to claim 12, wherein the second semiconductor layer is disposed on the first semiconductor layer.

18. The display device according to claim 17, wherein the first metal layer is disposed between the first semiconductor layer and the second semiconductor layer, and the second metal layer is disposed on a side of the second semiconductor layer away from the first metal layer;

wherein the display panel further discloses a third metal layer disposed on a side of the second metal layer away from the second semiconductor layer, wherein the third metal layer comprises a source and a drain, and orthographic projections of the source and the drain on the second metal layer are on both sides of the gate of the second transistor and are parallel to the gate of the second transistor.

19. The display device according to claim 18, wherein the first metal layer further comprises connection parts disposed on both sides of the gate of the first transistor and parallel to the gate of the first transistor, and orthographic projections of the connection parts on the third metal layer at least partially overlap the source and the drain.

20. The display device according to claim 12, wherein the pixel driving circuit further comprises:

a third transistor, wherein a source and a drain of the third transistor are electrically connected between one of a source and a drain of the first transistor, one of a source and a drain of the second transistor, and a data line, and a gate of the third transistor is electrically connected to a second scan line;

a fourth transistor, wherein a gate of the fourth transistor is electrically connected to a first scan line, and a source and a drain of the fourth transistor are electrically connected between a gate of the first transistor, a gate of the second transistor, and a third voltage terminal;

a fifth transistor, wherein a gate of the fifth transistor is electrically connected to a light-emitting control line, and a source and a drain of the fifth transistor are electrically connected between the first voltage terminal, the one of the source and the drain of the first transistor, and the one of the source and the drain of the second transistor;

a sixth transistor, wherein a gate of the sixth transistor is electrically connected to the light-emitting control line, a source and a drain of the sixth transistor are electrically connected between another one of the source and the drain of the first transistor, another one of the source and the drain of the second transistor, and an anode of the light-emitting device;

a seventh transistor, wherein a gate of the seventh transistor is electrically connected to the first scan line or the second scan line, and a source and a drain of the seventh transistor are electrically connected between the anode of the light-emitting device and a fourth voltage terminal;

an eighth transistor, wherein a gate of the eighth transistor is electrically connected to the second scan line, a source and a drain of the eighth transistor are electrically connected between a gate and one of a source and a drain of one of the driving transistors; and a storage capacitor connected in series between the first voltage terminal, the gate of the first transistor, and the gate of the second transistor.

\* \* \* \* \*